(12) United States Patent
Yang

(10) Patent No.: US 7,615,392 B2
(45) Date of Patent: Nov. 10, 2009

(54) LIGHT EMITTING DIODE AND METHOD OF MAKING THE SAME

(75) Inventor: Kuang-Neng Yang, Pen Chen (TW)

(73) Assignee: Epistar Corporation, Hsinchu (TW)

( * ) Notice: Subject to any disclaimer, the term of this patent is extended or adjusted under 35 U.S.C. 154(b) by 42 days.

(21) Appl. No.: 11/267,315

(22) Filed: Nov. 7, 2005

(65) Prior Publication Data

US 2006/0057752 A1  Mar. 16, 2006

Related U.S. Application Data

(62) Division of application No. 10/142,954, filed on May 13, 2002, now Pat. No. 7,129,527.

(30) Foreign Application Priority Data

Feb. 15, 2002 (TW) ............................... 91102629 A

(51) Int. Cl.
*H01L 21/329* (2006.01)
(52) U.S. Cl. ........................ 438/47; 438/464; 427/14; 427/79; 427/E21.352
(58) Field of Classification Search .................. 257/14, 257/79, E21.352
See application file for complete search history.

(56) References Cited

U.S. PATENT DOCUMENTS 5,798,535 A * 8/1998 Huang et al. ................ 257/83
6,071,795 A   6/2000 Cheung et al.
6,462,358 B1 * 10/2002 Lin et al. ..................... 257/99
6,566,155 B1 *  5/2003 Numai ........................ 438/31
6,682,950 B2 *  1/2004 Yang et al. .................. 438/47
6,709,883 B2 *  3/2004 Yang et al. .................. 438/47
2001/0048703 A1 * 12/2001 Oh ............................. 372/43
2002/0145147 A1 * 10/2002 Chiou et al. ................ 257/79

FOREIGN PATENT DOCUMENTS

JP          11-168236         6/1999

OTHER PUBLICATIONS

Windisch et al., "High-efficiency non-resonant cavity light-emitting diodes," Electronics Letters, vol. 34, No. 11, May 28, 1998, pp. 1153-1155.

* cited by examiner

*Primary Examiner*—Victor A Mandala
(74) *Attorney, Agent, or Firm*—Muncy, Geissler, Olds & Lowe, PLLC

(57) ABSTRACT

A light emitting diode (LED) and a method of making the same are disclosed. The present invention uses a metal layer of high conductivity and high reflectivity to prevent the substrate from absorbing the light emitted. This invention also uses the bonding technology of dielectric material thin film to replace the substrate of epitaxial growth with high thermal conductivity substrate to enhance the heat dissipation of the chip, thereby increasing the performance stability of the LED, and making the LED applicable under higher current.

13 Claims, 5 Drawing Sheets

LIGHT EMITTING DIODE AND METHOD OF MAKING THE SAME

This application is a Divisional of co-pending application Ser. No. 10/142,954 filed on May 13, 2002, and for which priority is claimed under 35 U.S.C. § 120; and this application claims priority of Application No. 091102629 filed in Taiwan, R.O.C. on Feb. 15, 2002 under 35 U.S.C. § 119; the entire contents of all are hereby incorporated by reference.

FIELD OF THE INVENTION

The present invention relates to a structure and a method of making a light emitting diode (LED) chip, and more particularly to a structure and a method of making an AlGaInP LED chip.

BACKGROUND OF THE INVENTION

The conventional AlGaInP LED, as shown in FIG. 1, has a double heterostructure (DH), which is consisted of a N-type GaAs substrate 3 and a plurality of layers sequentially formed thereon, wherein the layers are: an N-type $(Al_xGa_{1-x})_{0.5}In_{0.5}P$ lower cladding layer 4 with an Al composition of about 70%~100%, an $(Al_xGa_{1-x})_{0.5}In_{0.5}P$ active layer 5, a P-type $(Al_xGa_{1-x})_{0.5}In_{0.5}P$ upper cladding layer 6 with an Al composition of about 70%~100% and a P-type high energy gap GaAsP, InGaP, AlGaP, GaP, or AlGaAs current spreading layer 7. The emitting wavelength of the conventional LED structure can be changed by adjusting the composition of the active layer 5 to a wavelength from 650 run red to 555 nm pure green. One disadvantage of the conventional LED is that, when the light generated by the active layer 5 is emitted downward to the GaAs substrate 3, the light is absorbed by the GaAs substrate 3 due to a smaller energy gap of the GaAs substrate 3. Accordingly, the light-output performance of the LED is greatly reduced.

Some conventional LED technologies have been disclosed to prevent the light from being absorbed by the substrate. However, these conventional technologies still have some disadvantages and limitations. For example, Sugawara et al. disclosed a method, which has been published in Appl. Phys. Lett. Vol. 61, 1775-1777 (1992), that adding a distributed Bragg reflector (DBR) layer onto the GaAs substrate so as to reflect the light emitted downward to the GaAs substrate for decreasing the light absorbed by the GaAs substrate. However, because the DBR layer only reflects the light almost normal to the GaAs substrate, its efficiency is not very great.

Kish et al. disclosed a wafer-bonded transparent-substrate (TS) $(Al_xGa_{1-x})_{0.5}In_{0.5}P/GaP$ light emitting diode [Appl. Phys. Lett. Vol. 64, No. 21, 2839 (1994); Very high-efficiency semiconductor wafer-bonded transparent-substrate $(Al_xGa_{1-x})_{0.5}In_{0.5}P/GaP$]. This TS AlGaInP LED is fabricated by growing a very thick (about 50 μm) P-type GaP window layer with the use of hydride vapor phase epitaxy (HVPE). Before bonding, the P-type GaAs substrate is selectively removed by using chemical mechanical polishing and etching techniques. The exposed N-type $(Al_xGa_{1-x})_{0.5}In_{0.5}P$ cladding layers are subsequently wafer-bonded to 8 mil-10 mil thick N-type GaP substrate. The resulting TS AlGaInP LED exhibits the improvement in light output twice as much as the absorbing substrate (AS) AlGaInP LED. However, the fabrication process of TS AlGaInP LED is too complicated. Therefore, it is difficult to manufacture these TS AlGaInP LEDs in high yield and low cost.

Horng et al. reported a mirror-substrate (MS) AlGaInP/metal/$SiO_2$/Si LED fabricated by wafer-fused technology [Appl. Phys. Lett. Vol. 75, No. 20, 3054 (1999); AlGaInP light-emitting diodes with mirror substrates fabricated by wafer bonding]. They used AuBe/Au as the adhesive to bond the Si substrate and LED epilayers. However, the luminous intensity of these MS AlGaInP LEDs is about 90 mcd with 20 mA injection current, and is still 50% lower than the luminous intensity of TS AlGaInP LED.

SUMMARY OF THE INVENTION

As described above, the conventional LED has many disadvantages. Therefore, the present invention provides a LED structure and method of making the same to overcome the conventional disadvantages.

The present invention provides a light emitting diode. The light emitting diode comprises a multi-layered epitaxial structure with a light-emitting layer, a high-reflectivity metal layer formed on the multi-layered epitaxial structure, a dielectric adhesive layer, and a substrate having high thermal conductivity coefficient, wherein the multi-layered epitaxial structure is bonded to the substrate having high thermal conductivity coefficient by the dielectric adhesive layer. The light-emitting layer of the LED can be the structure of homostructure, single heterostructure (SH), double heterostructure (DH), or multi quantum wells (MQWs). Meanwhile, first and second ohmic contact metal layers are deposited to the first and second conductive epitaxial layers respectively. Besides, both the first and second ohmic contact metal layers are located on the same side.

The present invention provides a method for manufacturing a light emitting diode, which comprises the steps of: providing a LED epitaxial structure having a multi-layered AlGaInP epitaxial structure formed on a light-absorbing substrate; providing a substrate having high thermal conductivity coefficient (such as Si, Cu, Al, etc.); and using a dielectric adhesive layer, for example, BCB (B-staged bisbenzocyclobutene) resin, epoxy resin, polyimide, SOG (spin-on glass) or silicone to bond the substrate having high thermal conductivity coefficient and the multi-layered AlGaInP epitaxial structure. The light-absorbing substrate is then removed to expose the first conductive etching stop layer, so that for example a first ohmic contact metal layer is formed. The etching step also exposes the second conductive epitaxial layer to form a second ohmic contact layer. In addition, both the first and second ohmic contact metal layers are located on the same side.

An advantage of the present invention is to provide a simple LED structure, wherein the adhesion process for forming the LED structure can be performed at a lower temperature to prevent the evaporation problem of V group elements. Moreover, because the light is not absorbed by the substrate, the light emitting efficiency of the LED can be significantly improved.

Another advantage of the present invention is the use of the elastic dielectric adhesive layer to bond the LED and the substrate having high thermal conductivity coefficient. Therefore, an excellent bonding result can be obtained by using the elastic dielectric adhesive layer even if the epitaxial structure has a rough surface.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a LED structure and a method of making the same, and will be described in details as follows.

Figure 1:
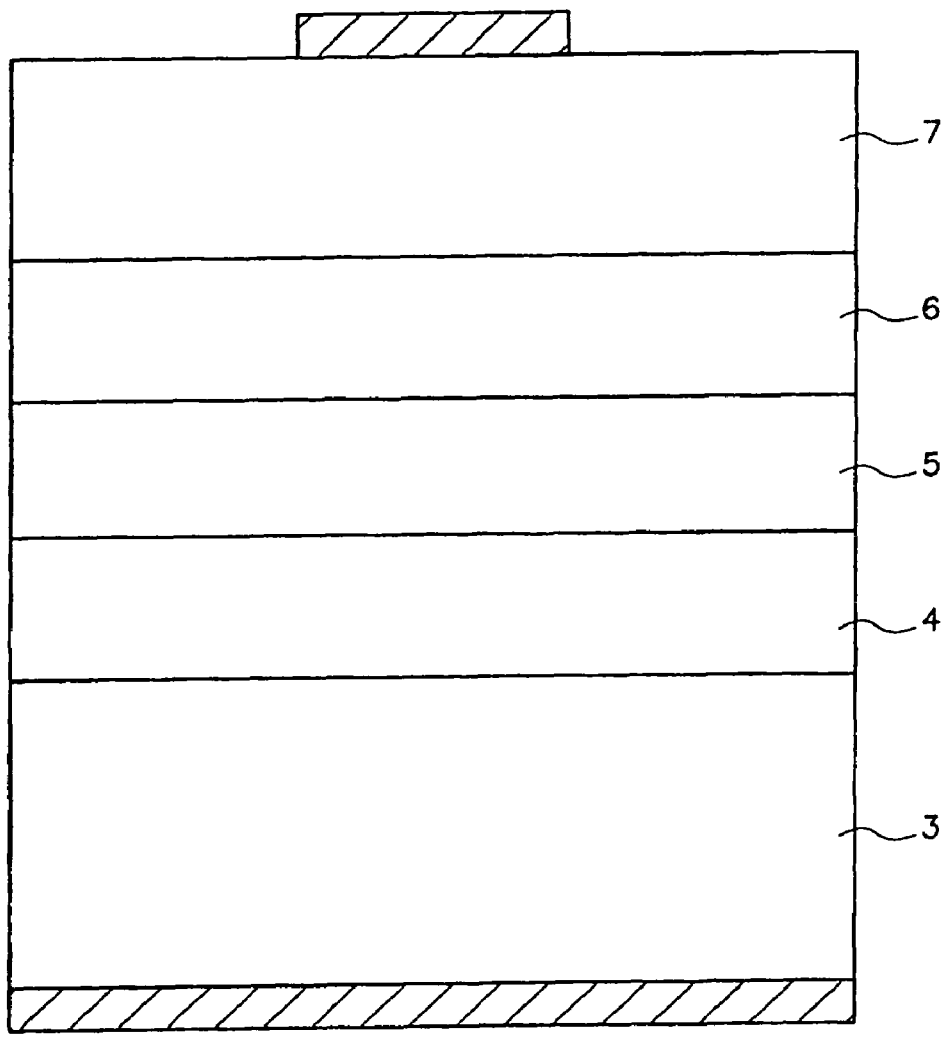
FIG. 1 is a diagram showing the structure of the LED according to the prior art.
Figure 2:
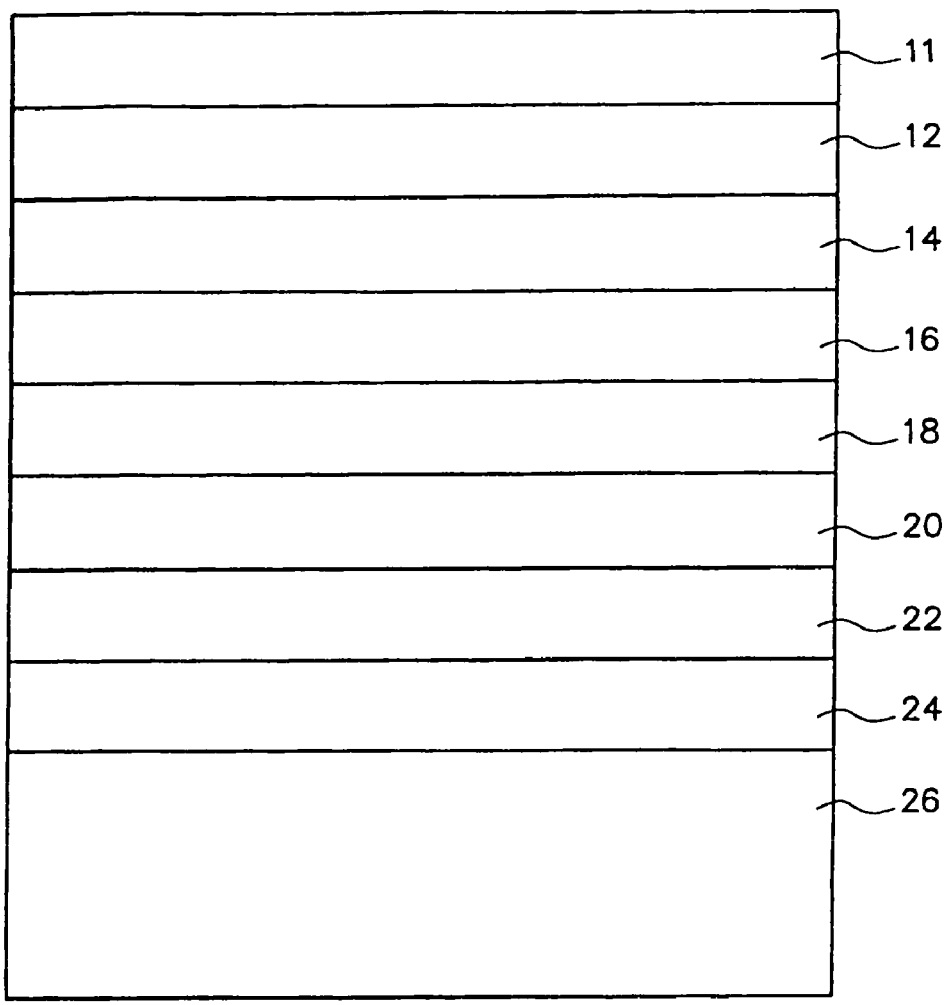
FIG. 2, FIG. 3, and FIG. 4 are diagrams showing the process of making the LED according to an embodiment of this invention.

Referring to FIG. 2, the epitaxial structure of light emitting diode of the present invention is composed of an N-type GaAs substrate 26, an etching stop layer 24, an N-type $(Al_xGa_{1-x})_{0.5}In_{0.5}P$ lower cladding layer 22, an $(Al_xGa_{1-x})_{0.5}In_{0.5}P$ active layer 20, a P-type $(Al_xGa_{1-x})_{0.5}In_{0.5}P$ upper cladding layer 18, and a P-type ohmic contact epitaxial layer 16.

Thereafter, a mirror surface protection layer 14 is deposited over the P-type ohmic contact epitaxial layer 16, wherein the material of the mirror surface protection layer 14 is selected from a group consisting of $SiN_x$, $SiO_2$, $Al_2O_3$, magnesium oxide, zinc oxide, tin oxide, indium oxide, and indium tin oxide.

Thereafter, a metal mirror surface layer 12 is deposited over the mirror surface protection layer 14, wherein the material of the metal mirror surface layer 12 is selected from a group consisting of Ag, Al, and Au. Then, a mirror surface protection layer 11 is deposited over the metal surface mirror layer 12, wherein the material of the mirror surface protection layer 11 is selected from a group consisting of $SiN_x$, $SiO_2$, $Al_2O_3$, magnesium oxide, zinc oxide, tin oxide, indium oxide, and indium tin oxide.

In the above description, the material of the P-type ohmic contact epitaxial layer 16 can be AlGaAs, AlGaInP, or GaAsP, as along as the energy gap of the material is larger than that of the active layer 20, and no light emitted from the active layer 20 is absorbed.

Moreover, the active layer 20 has an Al composition of about $0 \leq x \leq 0.45$, the lower cladding layer 22 has an Al composition of about $0.5 \leq x \leq 1$, and the upper cladding layer 18 has an Al composition of about $0.5 \leq x \leq 1$. If $x=0$, then the composition of the active layer 20 is $Ga_{0.5}In_{0.5}P$, and the wavelength $\lambda$ d of the LED is 635 nm.

In the above description, the compound ratio in $(Al_xGa_{1-x})_{0.5}In_{0.5}P$ is a preferred embodiment, and the present invention is not limited thereto. Additionally, the structure of the AlGaInP active layer 20 of the present invention can be a homostructure, a single heterostructure, a double heterostructure, or a multiple quantum wells structure. The so-called double heterostructure comprises the N-type $(Al_xGa_{1-x})_{0.5}In_{0.5}P$ lower cladding layer 22, the $(Al_xGa_{1-x})_{0.5}In_{0.5}P$ active layer 20 and the P-type $(Al_xGa_{1-x})_{0.5}In_{0.5}P$ upper cladding layer 18, such as shown in FIG. 2, wherein the preferred thickness of the lower cladding layer 22, that of the active layer 20, and that of the upper cladding layer 18 are about 0.5~3.0 μm, 0.5~2.0 μm, and 0.5~3.0 μm, respectively.

The preferred material of the etching stop layer 24 of the invention can be any III-V compound semiconductor material, provided that the lattice thereof is matched with that of the GaAs substrate 26, and the etching rate thereof is much smaller than that of the GaAs substrate 26. For example, InGaP or AlGaAs are suitable for forming the etching stop layer 24. In addition, the etching rate of the N-type AlGaInP lower cladding layer 22 is also far smaller than that of the GaAs substrate 26. Therefore, as long as the thickness of the lower cladding layer 22 is sufficient, it is not necessary to form an optional epitaxial layer of different composition as the etching stop layer 24.

Figure 3:
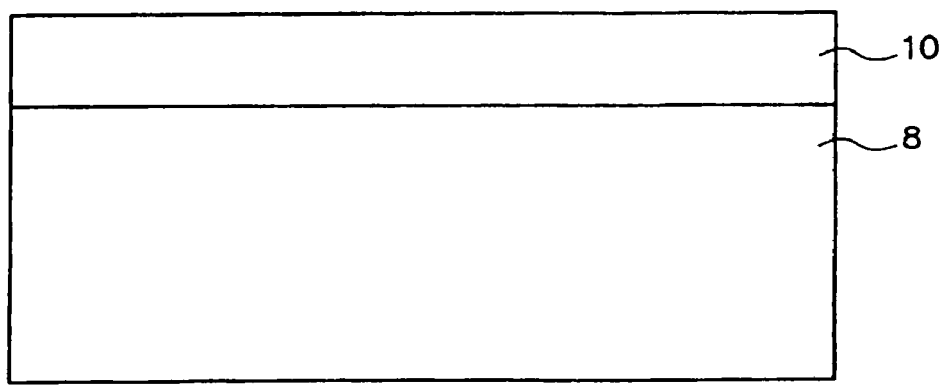

The structure shown in FIG. 3 comprises a dielectric adhesive layer 10, for example, BCB (B-staged bisbenzocyclobutene) resin and a substrate having high thermal conductivity coefficient 8. The material of the dielectric adhesive layer 10 is not limited to BCB. Any adhesive material with similar property, such as epoxy resin, polyimide, SOG, or silicone, etc. is also applicable to the present invention. The substrate having high thermal conductivity coefficient 8 can be composed of Si wafer, Cu wafer, or Al wafer, etc. One advantage of the present invention is that the substrate having high thermal conductivity coefficient 8 does not have to be a single crystal wafer. The substrate having high thermal conductivity coefficient 8 is used for mechanically supporting the LED epitaxial layer to prevent the epitaxial layer from breaking during the manufacturing process, and meanwhile is used as a heat sink, and the current does not flow through the substrate having high thermal conductivity coefficient 8 when the LED emits the light. In other words, the polycrystal or amorphous crystal can be used as the carrier substrate. Accordingly, the manufacture cost is significantly decreased.

Figure 4:
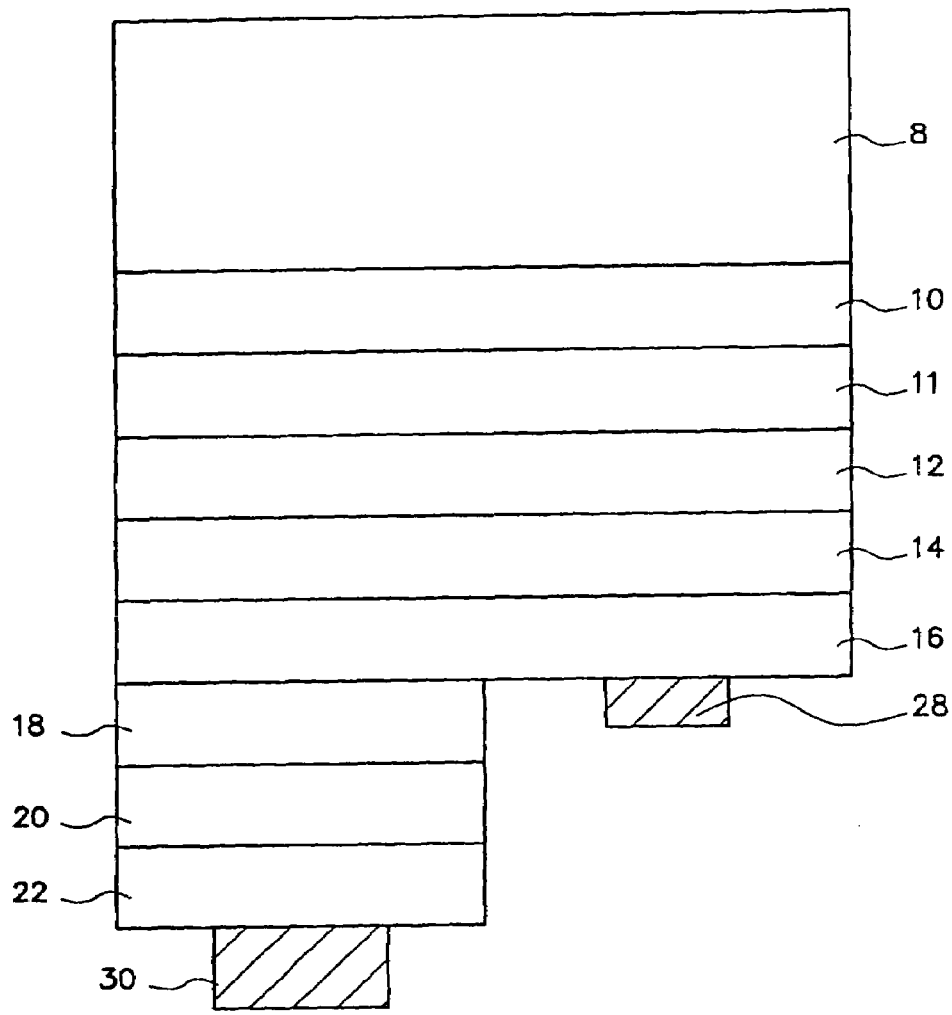

Thereafter, the epitaxial layer structure shown in FIG. 2 is bonded together with the substrate having high thermal conductivity coefficient 8 shown in FIG. 3 by the dielectric adhesive layer 10. The adhesion step is performed under high pressure and temperature, such as 250° C., according to the method of the present invention. A layer of adhesion promoter can be coated on the surface of the LED epitaxial structure and the surface of the substrate having high thermal conductivity coefficient 8 to improve the adhesion feature between the LED epitaxial structure and the substrate having high thermal conductivity coefficient 8. After that, a BCB layer is coated, and then the adhesion between the LED epitaxial structure and the substrate having high thermal conductivity coefficient 8 is completed under high pressure and temperature, such as 250° C. In order to provide better adhesion, the LED epitaxial structure, which is bonded with the substrate having high thermal conductivity coefficient 8 by the dielectric adhesive layer 10, can be first heated at a lower temperature, for example, 60° C. to 100° C., thereby removing the organic solvent in BCB, and then be heated at the temperature raised to a range between 200° C. and 600° C., so that the LED epitaxial structure, the substrate having high thermal conductivity coefficient 8, and the dielectric adhesive layer 10 can be tightly bonded. Thereafter, the opaque N-type GaAs substrate 26 is then removed by an etchant, for example, $1NH_4OH:1H_2O_2$. However, since the etching stop layer 24, InGaP or AlGaAs, still absorbs the light emitted from the active layer 20, it is necessary to remove the etching stop layer 24 completely or with only remaining a portion of the etching stop layer 24 contacting the N-type ohmic contact metal layer 30, such as shown in FIG. 4. A dry etching method, for example, RIE (reactive ion etching), is then applied to remove portion of the N-type AlGaInP lower cladding layer 22, that of the AlGaInP active layer 20, and that of the P-type AlGaInP upper cladding layer 18 to further expose the P-type ohmic contact epitaxial layer 16. A P-type ohmic contact metal layer 28 is then formed on the P-type ohmic contact epitaxial layer 16, and a N-type ohmic contact metal layer 30 is formed on the N-type AlGaInP lower cladding layer 22, so that a LED structure is formed, wherein the P-type and N-type ohmic contact metal layers formed on the same side, such as shown in FIG. 4.

According to the present invention, the light output power of the AlGaInP LED having wavelength of 635 nm is more than 4 mW (at 20 mA injection current), and is twice as much as that of the conventional absorbing substrate AlGaInP LED.

Figure 5:
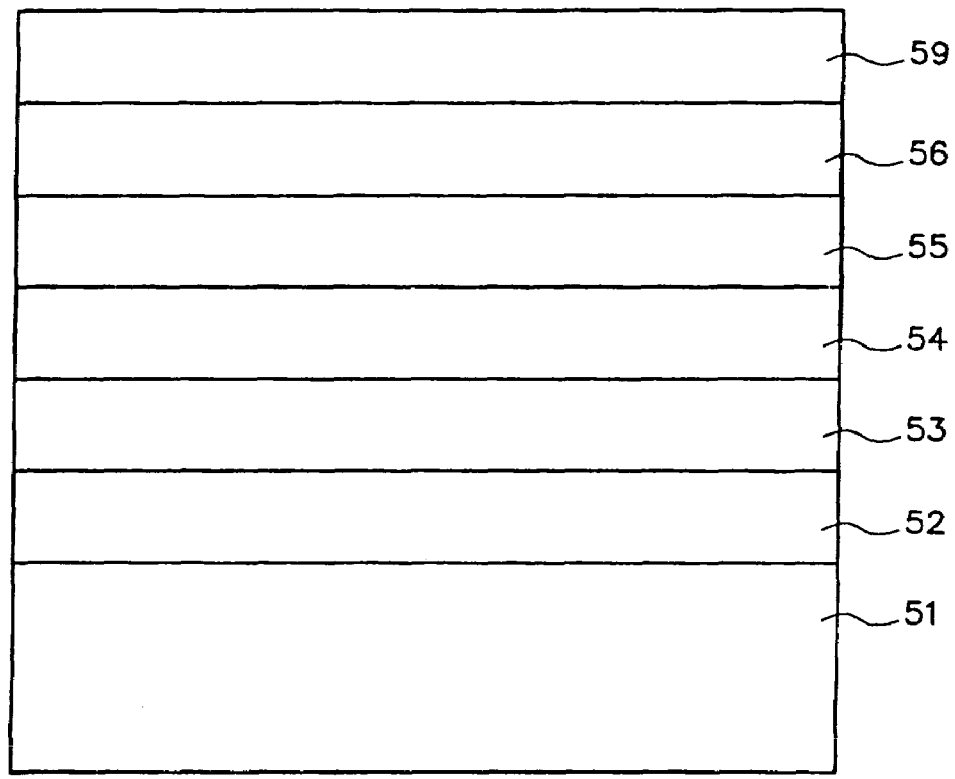
FIG. 5, FIG. 6, and FIG. 7 are diagrams showing the process of making the LED according to another embodiment of this invention.

The present invention is not limited to the AlGaInP LED having high brightness, and is also suitable for other LED materials, for example, red and infrared-red AlGaAs LED. The epitaxial structure shown on FIG. 5 is a cross-sectional view of the second embodiment of the present invention. The AlGaAs red LED (650 nm) includes a stacked structure of an N-type GaAs substrate 51, an N-type AlGaAs lower cladding layer 52 with Al composition of about 70~80% and thickness of 0.5 μm~3 μm, an AlGaAs active layer 53 with Al composition of about 35% and thickness of 0.5 μm~2 μm, and a P-type AlGaAs upper cladding layer 54 with Al composition of about 70~80% and thickness of 0.5 μm~3 μm, wherein the AlGaAs active layer 53 can be a homostructure, a single heterostructure, a double heterostructure, or a quantum well structure. Thereafter, a mirror surface protection layer 55, a metal mirror surface layer 56, and a mirror surface protection layer 59 are formed on the P-type AlGaAs upper cladding layer 54 in sequence, wherein the material of the mirror surface protection layer 55 and that of the mirror surface protection layer 59 can be selected from a group consisting of $SiN_x$, $SiO_2$, $Al_2O_3$, magnesium oxide, zinc oxide, tin oxide, indium oxide and indium tin oxide, and the material of the metal mirror surface layer 56 could be Ag, Al, or Au.

Figure 6:
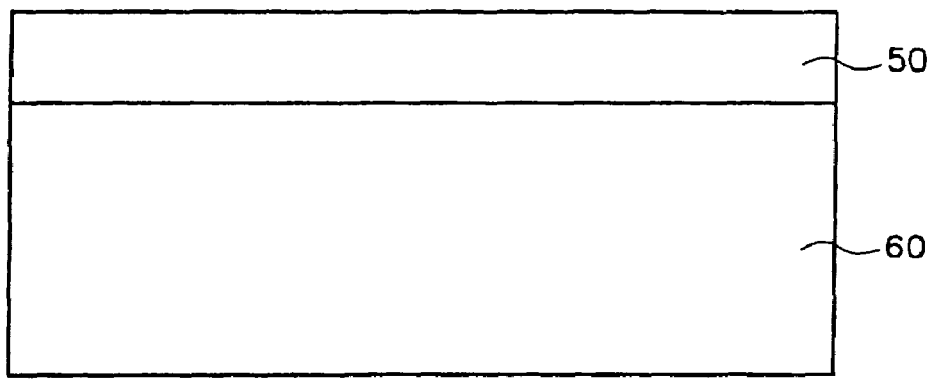

Referring to FIG. 6, the structure shown in FIG. 6 comprises a dielectric adhesive layer 50 and a substrate having high thermal conductivity coefficient 60, wherein the material of the dielectric adhesive layer 50 is BCB resin, for example. The material of the dielectric adhesive layer 50 in the present invention is not limited to BCB. Any adhesive material with similar property, such as epoxy resin, polyimide, SOG, or silicone, etc. is also applicable to the present invention. The substrate having high thermal conductivity coefficient 60 can be composed of Si wafer, Cu wafer, or Al wafer, etc. One advantage of the present invention is that the substrate having high thermal conductivity coefficient 60 does not have to be a single crystal wafer. The substrate having high thermal conductivity coefficient 60 is used for mechanically supporting the LED epitaxial layer to prevent the epitaxial layer from breaking, and is also used as a heat sink, and the current does not flow through the substrate having high thermal conductivity coefficient 60 when the LED emits the light. In other words, the polycrystal or amorphous crystal can be used as the carrier substrate. Accordingly, the manufacture cost is significant decreased.

Figure 7:
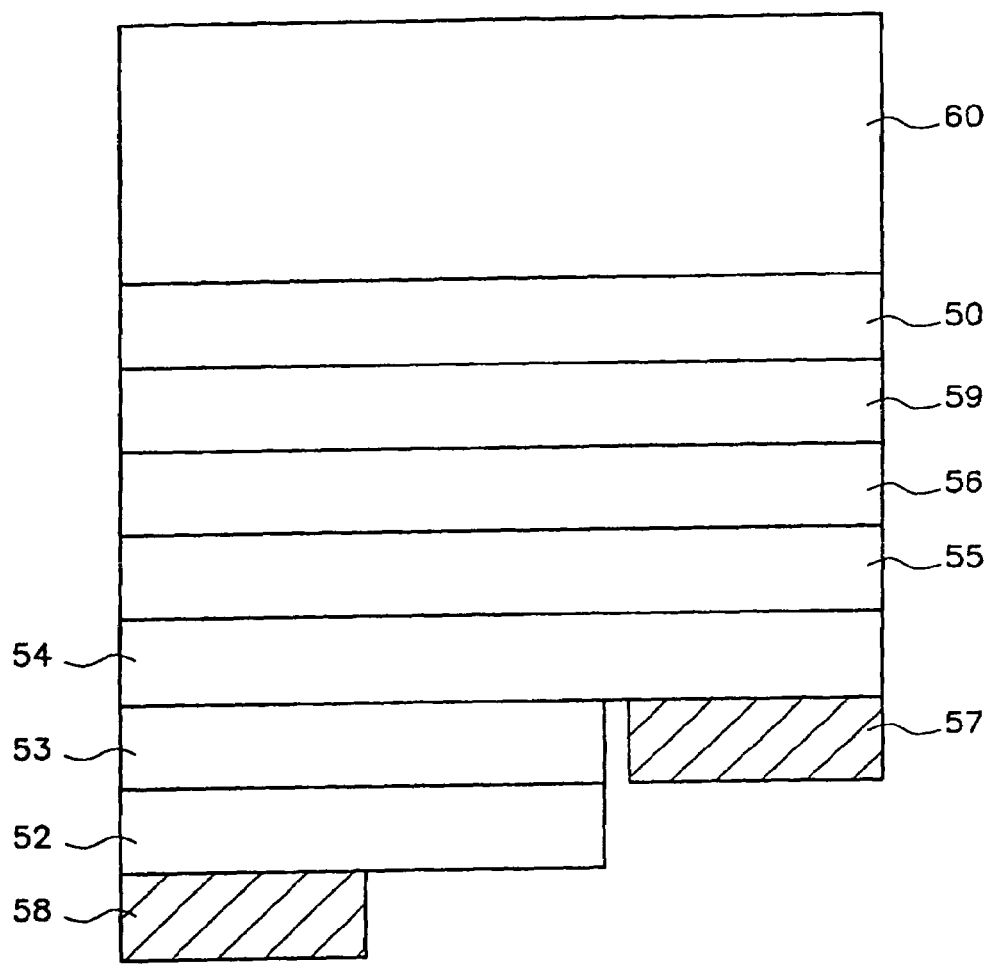

Referring to FIG. 7, the above-mentioned AlGaAs red LED structure in FIG. 5 is then bonded to the substrate having high thermal conductivity coefficient 60 by the dielectric adhesive layer 50. The epitaxial structure is then etched by an etchant, such as $1NH_4OH:1H_2O_2$ to remove the opaque N-type GaAs substrate 51. Thereafter, a wet etching or a dry etching is applied to remove portion of the N-type AlGaAs lower cladding layer 52 and that of the AlGaAs active layer 53 to further expose the P-type AlGaAs upper cladding layer 54. Then, a P-type ohmic contact metal layer 57 is formed on the P-type AlGaAs upper cladding layer 54, and a N-type ohmic contact metal layer 58 is then formed on the N-type AlGaAs lower cladding layer 52, so that a LED structure is formed, wherein the P-type and N-type ohmic contact metal layers are formed on the same side.

The light output power of the present invention AlGaAs LED with wavelength of about 650 nm is twice as much as that of the conventional absorbing substrate AlGaAs LED under the 20 mA injection current.

The present invention uses the substrate having high thermal conductivity coefficient to enhance the heat dissipation of the chip, thereby increasing the performance stability of the LED, and making the LED applicable at higher currents.

Moreover, the LED of the present invention uses of the elastic property of dielectric adhesive material to bond the substrate having high thermal conductivity coefficient and the multi-layered AlGaInP epitaxial structure. Therefore, an excellent bonding result can be obtained by the use of the elastic property of dielectric adhesive material, even if the epitaxial structure has a rough surface.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

What is claimed is:

1. A method of making a light emitting diode, comprising:
   providing a LED epitaxial structure having a stacked epitaxial structure formed on a light-absorbing substrate;
   providing a substrate having high thermal conductivity coefficient;
   using an elastic dielectric adhesive material to bond the substrate having high thermal conductivity coefficient and the LED epitaxial structure; and
   removing the light-absorbing substrate.

2. The method according to claim 1, wherein the light-absorbing substrate is made of GaAs.

3. The method according to claim 1, wherein the stacked epitaxial structure is made of AlGaInP.

4. The method according to claim 3, wherein the stacked epitaxial structure is selected from a group consisting of AlGaInP homostructure, AlGaInP single heterostrueture, AlGaInP double heterostructure, and AlGaInP quantum well.

5. The method according to claim 1, wherein the stacked epitaxial structure is made of AlGaAs.

6. The method according to claim 5, wherein the stacked epitaxial structure is selected from a group consisting of AlGaAs homostructure, AlGaAs single heterostructure, AlGaAs double heterostrueture, and AlGaAs quantum well.

7. The method according to claim 1, wherein the elastic dielectric adhesive material is selected from a group consisting of BCB, epoxy, polyimide, SOG, and silicone.

8. The in method according to claim 1, wherein the substrate having high thermal coefficient is selected from a group consisting of Si wafer, Cu wafer, and Al wafer.

9. The method according to claim 1, wherein the substrate having high thermal conductivity coefficient and the LED epitaxial structure are bonded by the stages comprising:
   a first stage, wherein a heating and pressing step is performed in a temperature between about 60° C. and about 100° C.; and
   a second stage, wherein a heating and pressing step is performed in a temperature between about 200° C. and about 600° C.

10. The method according to claim 1, wherein the LED epitaxial structure further comprises a first mirror surface protection layer, a metal minor surface layer, and a second mirror surface protection layer.

11. The method according to claim 10, wherein the first mirror surface protection layer is selected from a group consisting of $SiN_x$, $SiO_2$, $Al_2O_3$, magnesium oxide, zinc oxide, tin oxide, indium oxide, and indium tin oxide.

12. The method according to claim 10, wherein the second mirror surface protection layer is selected from a group consisting of $SiN_x$, $SiO_2$, $Al_2O_3$, magnesium oxide, zinc oxide, tin oxide, indium oxide, and indium tin oxide.

13. The method according to claim 10, wherein the metal mirror surface layer is selected from a group consisting of Ag, Al, and Au.

* * * * *

UNITED STATES PATENT AND TRADEMARK OFFICE
CERTIFICATE OF CORRECTION

PATENT NO. : 7,615,392 B2
APPLICATION NO. : 11/267315
DATED : November 10, 2009
INVENTOR(S) : Kuang-Neng Yang Page 1 of 1

It is certified that error appears in the above-identified patent and that said Letters Patent is hereby corrected as shown below:

Title Page, please correct Related U.S. Application Data as follows:

--(62) Division of application No. 10/142,954, filed on May 13, 2002, now Pat. No. 7,129,527, which is a Continuation-in-part of application No. 09/828,060, filed on Apr. 6, 2001, now Pat. No. 6,709,883.--

Signed and Sealed this
Sixteenth Day of July, 2013

Teresa Stanek Rea
*Acting Director of the United States Patent and Trademark Office*